United States Patent
Yun et al.

(10) Patent No.: US 8,916,970 B2
(45) Date of Patent: Dec. 23, 2014

(54) METHOD FOR WELDING GOLD-SILICON EUTECTIC CHIP, AND TRANSISTOR

(71) Applicant: Huawei Technologies Co., Ltd., Shenzhen (CN)

(72) Inventors: Lungang Yun, Shenzhen (CN); An Huang, Shenzhen (CN); Pengbo Tian, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/104,237

(22) Filed: Dec. 12, 2013

(65) Prior Publication Data

US 2014/0175641 A1 Jun. 26, 2014

Related U.S. Application Data

(63) Continuation of application No. PCT/CN2013/080708, filed on Aug. 2, 2013.

(30) Foreign Application Priority Data

Dec. 21, 2012 (CN) .......................... 2012 1 0562498

(51) Int. Cl.
*H01L 23/48* (2006.01)
*H01L 21/00* (2006.01)
*H01L 23/498* (2006.01)
*H01L 23/00* (2006.01)

(52) U.S. Cl.
CPC .......... *H01L 23/49811* (2013.01); *H01L 24/83* (2013.01); *H01L 2924/01322* (2013.01)
USPC .......................................... 257/737; 438/111

(58) Field of Classification Search
CPC .... H01L 24/02; H01L 23/49811; H01L 24/83
USPC .................. 257/778, 784, 785, 737
See application file for complete search history.

(56) References Cited

U.S. PATENT DOCUMENTS

| | | | | |
|---|---|---|---|---|
| 4,706,105 A | * | 11/1987 | Masuda et al. ................ | 257/695 |
| 6,798,072 B2 | * | 9/2004 | Kajiwara et al. .............. | 257/778 |
| 2007/0231954 A1 | | 10/2007 | Liu | |

FOREIGN PATENT DOCUMENTS

| | | |
|---|---|---|
| CN | 101047135 A | 10/2007 |
| CN | 201038156 Y | 3/2008 |
| JP | 6111553 A | 1/1986 |
| JP | 61222143 A | 10/1986 |

OTHER PUBLICATIONS

Partial English Translation and Abstract of Japanese Patent Application No. JP6111553A, Feb. 13, 2014, 7 pages.
Foreign Communication From a Counterpart Application, PCT Application No. PCT/CN2013/080708, English Translation from a International Search Report dated Nov. 14, 2013, 3 pages.
Foreign Communication From a Counterpart Application, PCT Application No. PCT/CN2013/080708, Written Opinion dated Nov. 14, 2013, 5 pages.

\* cited by examiner

*Primary Examiner* — William D Coleman
(74) *Attorney, Agent, or Firm* — Conley Rose, P.C.; Grant Rudolph; Nicholas K. Beaulieu

(57) ABSTRACT

Relating to electronic components, the present disclosure provides a method for welding a gold-silicon eutectic chip, and a transistor. The method for welding a gold-silicon eutectic chip includes: electroplating a gold layer with a thickness smaller than or equal to 1 micron on surfaces of a chip carrier; bonding multiple gold protrusions on the gold layer in a welding region; and rubbing a chip in the welding region at a eutectic temperature to form a welding layer. The transistor includes a chip, a chip carrier, and a middle layer connecting the chip and the chip carrier, where the welding middle layer is a welding layer obtained by using the above welding method. The present disclosure reduces an amount of gold in use and lowers a cost of gold-silicon eutectic welding to a relatively large extent, and, accordingly, cuts down the cost of a transistor.

20 Claims, 3 Drawing Sheets

METHOD FOR WELDING GOLD-SILICON EUTECTIC CHIP, AND TRANSISTOR

CROSS-REFERENCE TO RELATED APPLICATIONS

This application is a continuation of International Application No. PCT/CN2013/080708, filed on Aug. 2, 2013, which claims priority to Chinese Patent Application No. 201210562498.1, filed on Dec. 21, 2012, both of which are hereby incorporated by reference in their entireties.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present disclosure relates to electronic components, and in particular, to a method for welding a gold-silicon eutectic chip, and a transistor.

BACKGROUND

Generally, a physical connection between a chip of a power semiconductor and a chip carrier is implemented in a manner of gold-silicon eutectic welding. A specific implementation process is: as shown in FIG. 1 and FIG. 2, a gold layer is first electroplated on surfaces of a metal-material chip carrier 21; a chip 23 with a silicon substrate is then rubbed in a welding region 22 on the chip carrier 21 at a temperature above a gold-silicon eutectic temperature (363 degrees Celsius (° C.)); a liquid gold-silicon alloy is formed after gold-silicon reaction; and a gold-silicon alloy layer 24 formed after the liquid gold-silicon alloy is cooled implements a physical connection between the chip 23 and the chip carrier 21.

However, in order to achieve a proper connection between the chip and the chip carrier, it is generally required that the gold layer plated on the chip carrier be at least 2.5 microns in thickness. Further, as is limited by electroplating techniques, the chip carrier usually can only be plated with gold as a whole. That is, all outer surfaces (including a top surface 211, a side surface 212, and a bottom surface 213, which are shown in FIG. 2) of the chip carrier are plated with gold simultaneously. For current electroplating techniques, it is hard to plate only one surface of the chip carrier with gold, or plate the welding region 22 partially with gold. However, an area of the welding region only accounts for a few percent of an area of all the outer surfaces of the chip carrier, and a gold plating cost is calculated based on a gold plating area (a sum of areas of six surfaces of a cube), and therefore a cost of the chip carrier is high. In addition, as the gold price keeps rising, the cost of the chip carrier will also keep rising. Therefore, a cost of applying gold-silicon eutectic welding to power electronic products will be higher and higher.

Therefore, it is necessary for those skilled in the art to provide a welding method, which further reduces the cost of gold-silicon eutectic welding on the premise of ensuring a proper connection between a chip and a chip carrier.

SUMMARY

The present disclosure provides a method for welding a gold-silicon eutectic chip, and a transistor, to resolve a technical problem in a current gold-silicon eutectic welding method that a cost of a transistor increases because a gold layer electroplated on a chip carrier is relatively thick.

In order to achieve the above objective, the present disclosure adopts the following technical solution.

In one aspect, a method for welding a gold-silicon eutectic chip is provided, including: electroplating a gold layer with a thickness smaller than or equal to 1 micron on surfaces of a chip carrier; bonding multiple gold protrusions on the gold layer in a welding region; and rubbing a chip in the welding region at a eutectic temperature, to cause the gold protrusions to react with a surface of the chip to form silicon-gold welding points, so as to implement packaging of the chip on the carrier.

In a first possible implementation manner, the gold layer is pure gold or palladium gold.

In a second possible implementation manner, when the gold layer is pure gold, a thickness of the gold layer is 0.3-1.0 micron; when the gold layer is palladium gold, a thickness of a palladium layer part is 0.05-0.2 microns, and a thickness of a gold layer part is 0.05-0.2 microns.

In a third possible implementation manner, the gold protrusions are one or more types of dot-shaped protrusions, line-shaped protrusions, and stripe-shaped protrusions.

In a fourth possible implementation manner, a diameter of the line-shaped protrusions is greater than or equal to 15 microns.

In a fifth possible implementation manner, a thickness of the stripe-shaped protrusions is greater than or equal to 6 microns.

In another aspect, a transistor is provided, including a chip, a chip carrier, and a middle layer connecting the chip and the chip carrier, where the middle layer is a welding layer obtained by using the above welding method.

In a first possible implementation manner, the transistor is a transistor with silicon as a substrate.

By using the method for welding a gold-silicon eutectic chip and the transistor provided in the embodiments of the present disclosure, a gold layer with a thickness smaller than or equal to 1 micron is first electroplated on surfaces of a chip carrier, multiple gold protrusions are then bonded on the gold layer in a welding region, and finally the chip is rubbed in the welding region at the eutectic temperature to form a welding layer. This is equivalent to increasing the thickness of the gold layer in the welding region partially. The gold protrusions provide most gold required by gold-silicon eutectic welding, which reduces an amount of gold in use and lowers the cost of gold-silicon eutectic welding to a relative large extent, and accordingly, cuts down the cost of a transistor.

BRIEF DESCRIPTION OF THE DRAWINGS

To illustrate the technical solutions in the embodiments of the present disclosure or in the prior art more clearly, the following briefly introduces the accompanying drawings required for describing the embodiments or the prior art. The accompanying drawings in the following description show merely some embodiments of the present disclosure, and a person of ordinary skill in the art may still derive other drawings from these accompanying drawings without creative efforts.

DETAILED DESCRIPTION

The following clearly describes the technical solutions in the embodiments of the present disclosure with reference to the accompanying drawings in the embodiments of the present disclosure. The described embodiments are merely a part rather than all of the embodiments of the present disclosure. All other embodiments obtained by a person of ordinary skill in the art based on the embodiments of the present disclosure without creative effort shall fall within the protection scope of the present disclosure.

Figure 1:
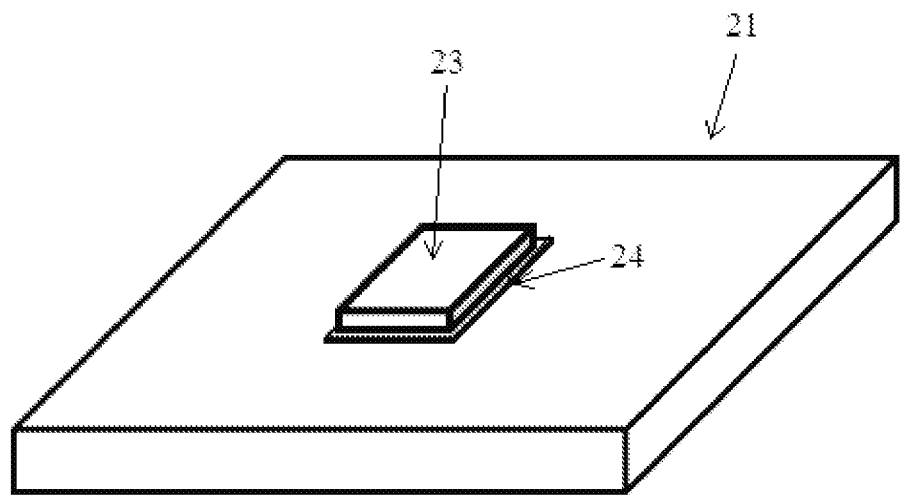
FIG. 1 is a schematic structural diagram of a chip carrier in the prior art.
Figure 2:
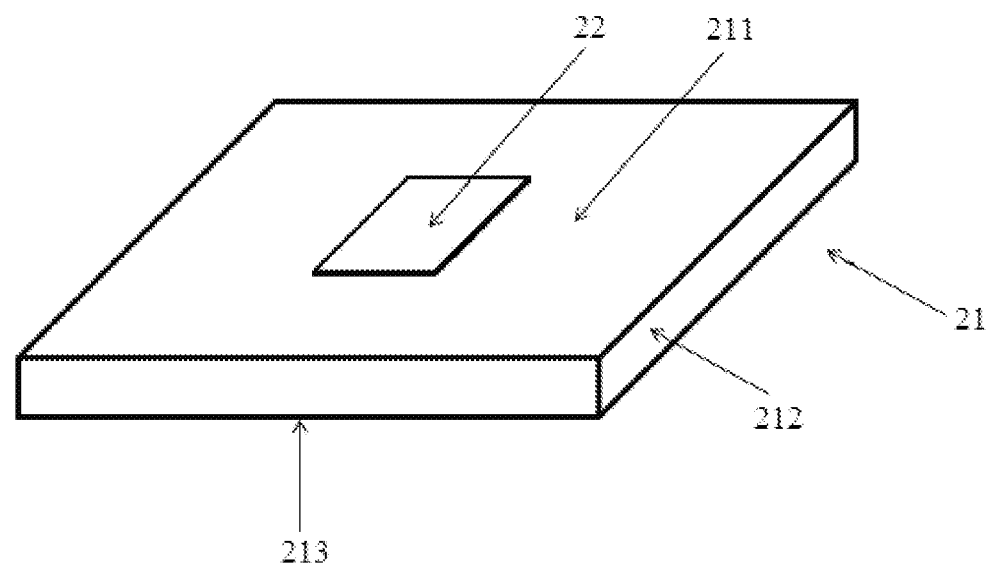
FIG. 2 is a schematic structural diagram of a chip and a chip carrier in the prior art.
Figure 3:
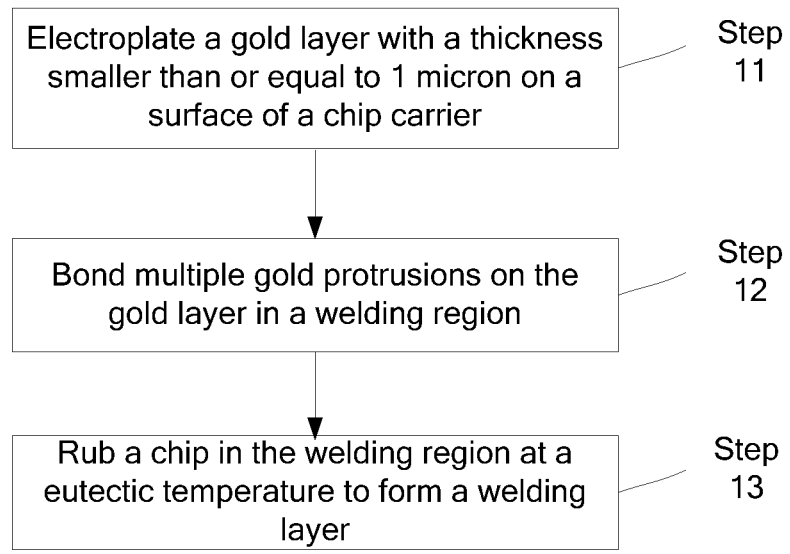
FIG. 3 is a flowchart of a method for welding a gold-silicon eutectic chip according to an embodiment of the present disclosure.

FIG. 3 is a flowchart of a method for welding a gold-silicon eutectic chip according to the present disclosure, and the method includes the following steps.

Figure 4:
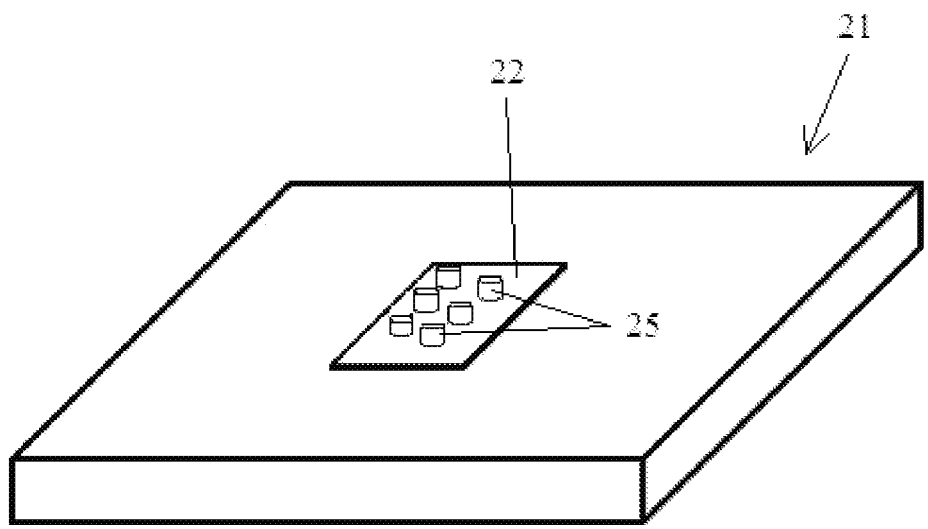
FIG. 4 is a schematic structural diagram of a chip carrier according to an embodiment of the present disclosure.
Figure 5:
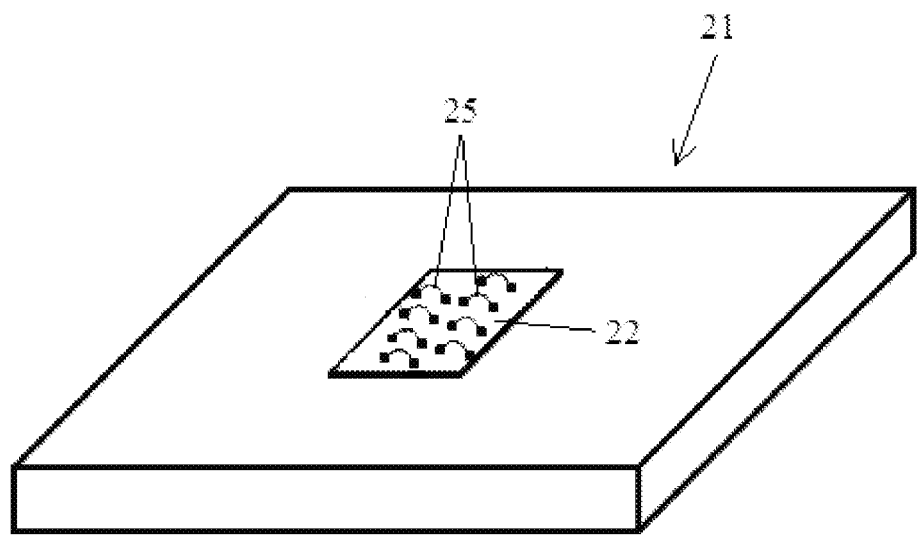
FIG. 5 is another schematic structural diagram of a chip carrier according to an embodiment of the present disclosure.
Figure 6:
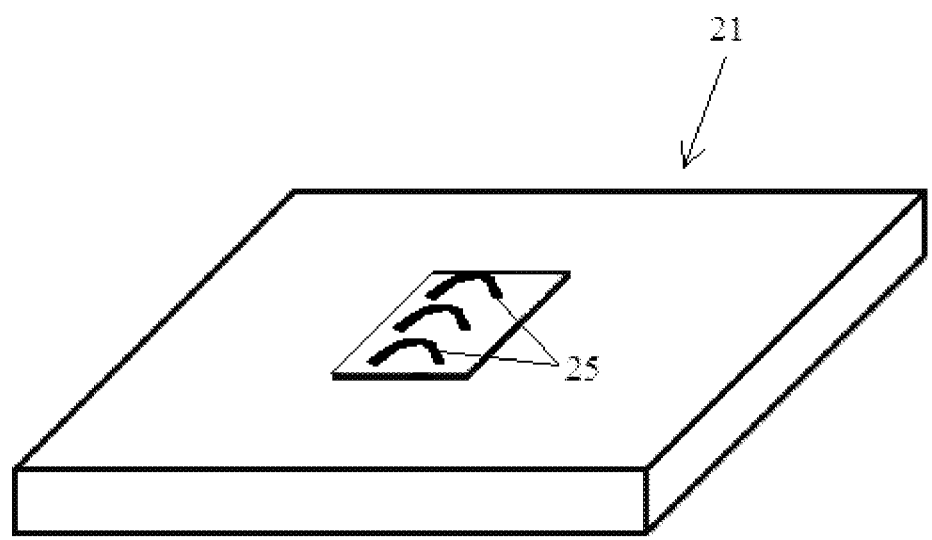
FIG. 6 is another schematic structural diagram of a chip carrier according to an embodiment of the present disclosure.

Step 11: Referring to FIG. 4 to FIG. 6, electroplate a gold layer with a thickness smaller than or equal to 1 micron on surfaces of a chip carrier 21.

Because electroplating may implement an even and relatively thin plating layer, the chip carrier herein adopts a metal material that can be electroplated, such as a molybdenum alloy, a tungsten alloy, a copper alloy, a copper-molybdenum alloy, or a combination of more than one of the alloys. The gold layer may be a pure gold layer or a palladium gold layer composed of a palladium layer and a gold layer. When the gold layer is a pure gold layer, a thickness of the pure gold layer is 0.3-1.0 micron. When the gold layer is a palladium gold layer, a thickness of the palladium layer part is 0.05-0.2 microns, and a thickness of the gold layer part is 0.05-0.2 microns, where, in an electroplating process thereof, the palladium layer is electroplated first, and then the gold layer is electroplated on the palladium layer.

The thickness of the electroplated gold layer herein is smaller than or equal to 1 micron, which is much smaller than 2.5 microns of a gold layer electroplated in the prior art.

Step 12: Referring to FIG. 4 to FIG. 6, bond multiple gold protrusions 25 on the gold layer in a welding region 22.

For current electroplating techniques, it is hard to plate gold partially on the chip carrier 21. Therefore, a bonding method is adopted in the present disclosure to form multiple gold protrusions 25 in the welding region 22 of the gold layer. In this manner, the gold protrusions 25 provide most gold required by gold-silicon eutectic welding, while other regions on the chip carrier 21 only have a relatively thin gold layer with a thickness smaller than or equal to 1 micron. This reduces the amount of gold in use and lowers the cost of gold-silicon eutectic welding to a relatively large extent.

In the present disclosure, the bonding method that implements the gold protrusions is the same as a wire bonding method in the semiconductor packaging industry. Generally, wire bonding means using a metal wire to implement an electrical connection between a semiconductor chip and a wire frame or between a chip and a baseboard. By form, wire bonding includes two categories, namely, ball bonding and wedge bonding. In the semiconductor packaging industry, the most widely applied metal wires are gold wires, and the next are aluminum wires and copper wires. In the present disclosure, gold wire bonding is adopted, where a gold wire is used to bond gold protrusions on the gold layer. The gold protrusions 25 may be dot-shaped as shown in FIG. 4, line-shaped as shown in FIG. 5, stripe-shaped as shown in FIG. 6, or a combination of one or more of the shapes. No matter what shape the gold protrusions are in, a limitation on a size of the gold protrusions should be met: a sum of volumes of the gold protrusions and the gold layer in the welding region is no less than the volume of the gold layer in the welding region when the thickness of the gold layer is 2.5 microns in the prior art. Only in this way can a proper connection between the chip and the chip carrier be achieved after the welding.

In addition, when the gold protrusions are dot-shaped protrusions, a gold wire bought from the market may be used to form multiple ball points in the welding region by using a ball bonding apparatus. When the gold protrusions are line-shaped protrusions, a gold wire bought from the market may be used to form a series of bonding wires by using either a ball bonding apparatus or a wedge bonding apparatus. When the gold protrusions are stripe-shaped protrusions, a gold stripe bought from the market may be welded on the gold layer in the welding region to form a series of stripe-shaped bonding wires by using a wedge bonding apparatus. A diameter of a gold wire used in ball bonding or wedge bonding is preferably greater than or equal to 15 microns, and a thickness of a gold stripe used in wedge bonding is preferably greater than or equal to 6 microns.

Step 13: Rub a chip in the welding region at a eutectic temperature to form a welding layer.

Gold and silicon can form a eutectic alloy only at the eutectic temperature, and the eutectic temperature of gold and silicon is 363° C. under the atmospheric pressure. The chip is rubbed with the gold protrusions in the welding region when the chip carrier is heated to reach the eutectic temperature to form an even gold-silicon welding layer, thereby connecting the chip and the chip carrier properly.

Based on the above, by using the method for welding a gold-silicon eutectic chip provided in the embodiment of the present disclosure, a gold layer with a thickness smaller than or equal to 1 micron is first electroplated on surfaces of a chip carrier, multiple gold protrusions are then bonded on the gold layer in a welding region, and finally the chip is rubbed in the welding region at the eutectic temperature to form a welding layer. This is equivalent to increasing the thickness of the gold layer in the welding region partially. The gold protrusions provide most gold required by gold-silicon eutectic welding, which reduces the amount of gold in use and lowers the cost of gold-silicon eutectic welding to a relatively large extent.

External connection is performed after the gold-silicon eutectic welding is complete, and the chip is connected to an external terminal by using wire bonding.

An embodiment of the present disclosure further provides a transistor, which includes a chip, a chip carrier, and a middle layer connecting the chip and the chip carrier, where the middle layer is a welding layer obtained by using the above gold-silicon eutectic welding method.

In the transistor provided in the embodiment of the present disclosure, because the middle layer connecting the chip and the chip carrier is a welding layer obtained by using the above gold-silicon eutectic welding method, the cost of the transistor is reduced accordingly.

The transistor in the above embodiment may be a radio frequency field effect transistor in a wireless base station, or a power transistor with a high-power chip that takes silicon as a substrate in another electronic component.

Usually, for a radio frequency power field effect transistor, an upper surface of the chip carrier is welded with a chip, and a lower surface of the chip carrier is welded on a circuit board. The former adopts the gold-silicon eutectic welding technology, and the latter is welded by using tin-contained solder. Theoretically, requirements for gold thicknesses are different when the upper and lower surfaces of the chip carrier are welded. It is hoped that the gold thickness in the region of the upper surface where the chip is welded be no less than 2.5 microns (thick gold), and that the gold thickness of the lower surface be controlled within a range of 0.08-1 micron (thin gold). Because a gold-tin compound with a relatively great brittleness may be generated when the chip carrier and the circuit board are welded, if the gold thickness reaches above 1 micron, it is highly risky that the gold-tin compound makes the welding points crack. It is apparent that the requirements of the two types of welding for gold plating on the chip carrier are contradictory. Generally, in the prior art, it is required that gold with a thickness at least 2.5 microns is plated on the entire chip. As a result, on the one hand, because the amount of gold in use is large, the cost of a radio frequency power field effect transistor is increased; on the other hand, because the thickness of the gold on the lower surface of the chip carrier is greater than 1 micron, the risk that the gold-tin compound makes the welding points crack is increased. Therefore, by using the transistor provided in the present disclosure as a radio frequency power field effect transistor, the above problems can be resolved.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A method for welding a gold-silicon eutectic chip, comprising:
    electroplating a gold layer with a thickness smaller than or equal to 1 micron on all outer surfaces of a metal-material chip carrier, wherein the metal-material chip carrier comprises a top surface, a bottom surface, and side surfaces, and wherein the top surface, the bottom surface, and the side surfaces are electroplated with the gold layer;
    bonding multiple gold protrusions on the gold layer in a welding region of the metal-material chip carrier, wherein the welding region of the metal-material chip carrier comprises a portion of the top surface of the metal-material chip carrier; and
    rubbing a silicon chip in the welding region at a eutectic temperature to cause the gold protrusions to react with a surface of the silicon chip to form silicon-gold welding points to implement packaging of the silicon chip on the metal-material chip carrier.

2. The method for welding the gold-silicon eutectic chip according to claim 1, wherein the gold layer is pure gold or palladium gold.

3. The method for welding the gold-silicon eutectic chip according to claim 1, wherein the gold protrusions are one or more types of dot-shaped protrusions, line-shaped protrusions, and stripe-shaped protrusions.

4. The method for welding the gold-silicon eutectic chip according to claim 2, wherein a thickness of the gold layer is 0.3-1.0 micron when the gold layer is pure gold, and wherein a thickness of a palladium layer part is 0.05-0.2 microns and a thickness of a gold layer part is 0.05-0.2 microns when the gold layer is palladium gold.

5. The method for welding the gold-silicon eutectic chip according to claim 3, wherein a diameter of the line-shaped protrusions is greater than or equal to 15 microns.

6. The method for welding the gold-silicon eutectic chip according to claim 3, wherein a thickness of the stripe-shaped protrusions is greater than or equal to 6 microns.

7. A transistor, comprising:
    a silicon chip;
    a metal-material chip carrier; and
    a middle layer connecting the silicon chip and the metal-material chip carrier, wherein the middle layer is obtained by using a welding method comprising:
        electroplating a gold layer with a thickness smaller than or equal to 1 micron on all outer surfaces of the metal-material chip carrier, wherein the metal-material chip carrier comprises a top surface, a bottom surface, and side surfaces, and wherein the top surface, the bottom surface, and the side surfaces are electroplated with the gold layer;
        bonding multiple gold protrusions on the gold layer in a welding region of the metal-material chip carrier, wherein the welding region of the metal-material chip carrier comprises a portion of the top surface of the metal-material chip carrier; and
        rubbing the silicon chip in the welding region at a eutectic temperature to cause the gold protrusions to react with a surface of the silicon chip to form silicon-gold welding points to implement packaging of the silicon chip on the metal-material chip carrier.

8. The transistor according to claim 7, wherein the transistor is a transistor with silicon as a substrate.

9. The transistor according to claim 7, wherein the transistor comprises a radio frequency field effect transistor in a wireless base station.

10. The transistor according to claim 7, wherein the transistor comprises a high-power chip that takes silicon as a substrate in another electronic component.

11. The transistor according to claim 7, wherein the gold layer comprises gold.

12. The transistor according to claim 7, wherein the gold layer comprises palladium gold.

13. The transistor according to claim 7, wherein the gold protrusions comprise dot-shaped protrusions.

14. The transistor according to claim 7, wherein the gold protrusions comprise line-shaped protrusions.

15. The transistor according to claim 7, wherein the gold protrusions comprise stripe-shaped protrusions.

16. The transistor according to claim 7, wherein the gold protrusions comprise a combination of two or more of dot-shaped protrusions, line-shaped protrusions, and stripe-shaped protrusions.

17. The transistor according to claim 11, wherein a thickness of the gold layer is 0.3-1.0 microns.

18. The transistor according to claim 12, wherein a thickness of a palladium layer part is 0.05-0.2 microns and a thickness of a gold layer part is 0.05-0.2 microns.

19. The transistor according to claim 14, wherein a diameter of the line-shaped protrusions is greater than or equal to 15 microns.

20. The transistor according to claim 15, wherein a thickness of the stripe-shaped protrusions is greater than or equal to 6 microns.

* * * * *